United States Patent
Lee et al.

(10) Patent No.: US 8,970,256 B2
(45) Date of Patent: Mar. 3, 2015

(54) SENSE AMPLIFIER

(71) Applicant: Taiwan Semiconductor Manufacturing Co., Ltd., Hsin-Chu (TW)

(72) Inventors: Cheng Hung Lee, Hsinchu (TW); Hektor Huang, New Taipei (TW); Chi-Kai Hsieh, Yangmei (TW); Shi-Wei Chang, Hsinchu (TW); Hong-Chen Cheng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/888,620

(22) Filed: May 7, 2013

(65) Prior Publication Data

US 2014/0266436 A1 Sep. 18, 2014

Related U.S. Application Data

(60) Provisional application No. 61/781,654, filed on Mar. 14, 2013.

(51) Int. Cl.
*G11C 7/00* (2006.01)
*H03F 3/45* (2006.01)

(52) U.S. Cl.
CPC .................. *H03F 3/45076* (2013.01)

USPC .............................................. 327/52; 327/55

(58) Field of Classification Search
USPC ........................................................ 327/55
See application file for complete search history.

(56) References Cited

U.S. PATENT DOCUMENTS

| | | | |
|---|---|---|---|
| 6,184,722 B1* | 2/2001 | Hayakawa | 327/55 |
| 6,424,181 B1* | 7/2002 | Pogrebnoy | 327/55 |
| 6,449,191 B1* | 9/2002 | Lin et al. | 365/185.21 |
| 6,791,372 B2* | 9/2004 | Jaussi | 327/65 |
| 7,046,045 B2* | 5/2006 | Nakazato et al. | 327/55 |
| 7,263,016 B1* | 8/2007 | Palumbo et al. | 365/205 |
| 7,298,180 B2* | 11/2007 | Hung | 327/57 |
| 7,586,803 B2* | 9/2009 | Do | 365/205 |
| 7,768,320 B1* | 8/2010 | Yang et al. | 327/55 |
| 2005/0264324 A1* | 12/2005 | Nakazato et al. | 327/55 |

* cited by examiner

*Primary Examiner* — Ryan Jager
(74) *Attorney, Agent, or Firm* — Eschweiler & Associates, LLC

(57) ABSTRACT

The present disclosure relates to a differential sense amplifier comprising first and second cross-coupled inverters with first and second complimentary storage nodes. A first current control element changes a current through the first cross-coupled inverter based upon an output of a second cross-coupled inverter, and a second current control element changes a current through the second cross-coupled inverter based upon an output of the first cross-coupled inverter. Other devices and methods are also disclosed.

15 Claims, 9 Drawing Sheets

SENSE AMPLIFIER

CROSS REFERENCE TO RELATED APPLICATIONS

This application is a Non-Provisional Patent Application claiming priority to Provisional Patent Application Ser. No. 61/781,654 filed Mar. 14, 2013 entitled "A Sense Amplifier" in the name of Cheng Hung Lee, et al. and is hereby incorporated by reference.

BACKGROUND

Increasing memory capacity requirements within microelectronic devices of next-generation semiconductor technology nodes combined with lower power consumption and higher speed demands has driven an increase in the number of memory cells per bitline within memory arrays, resulting in a decrease in the supply voltage allocated to each memory cell within the array, which in turn drives lower noise margins and degrades sense amplifier reliability.

DETAILED DESCRIPTION

Figure 1A:
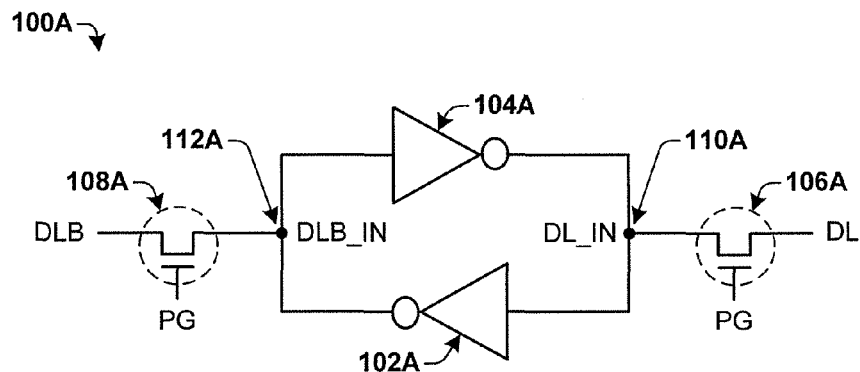
FIGS. 1A-1C illustrate pull-down mismatch between a pair of cross-coupled inverters.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Some semiconductor memory devices include read-write memories such as static random-access memory (SRAM) in which data is stored as the state of a bistable memory cell, or dynamic random-access memory (DRAM) which stores data as a charge on a capacitor within a memory cell. Because the stored state of the SRAM or DRAM degrades in the absence of an external power supply, these storage types are considered volatile. Some non-volatile memory types, which can retain data when power is disabled, include read-only memory (ROM) and non-volatile read-write memory (NVRWM) such as flash memory. Semiconductor memory devices typically include an array of such memory cells. To discern between data states stored in the individual memory cells, sense amplifiers are also included in these memory devices.

Figures 1B, 1C:
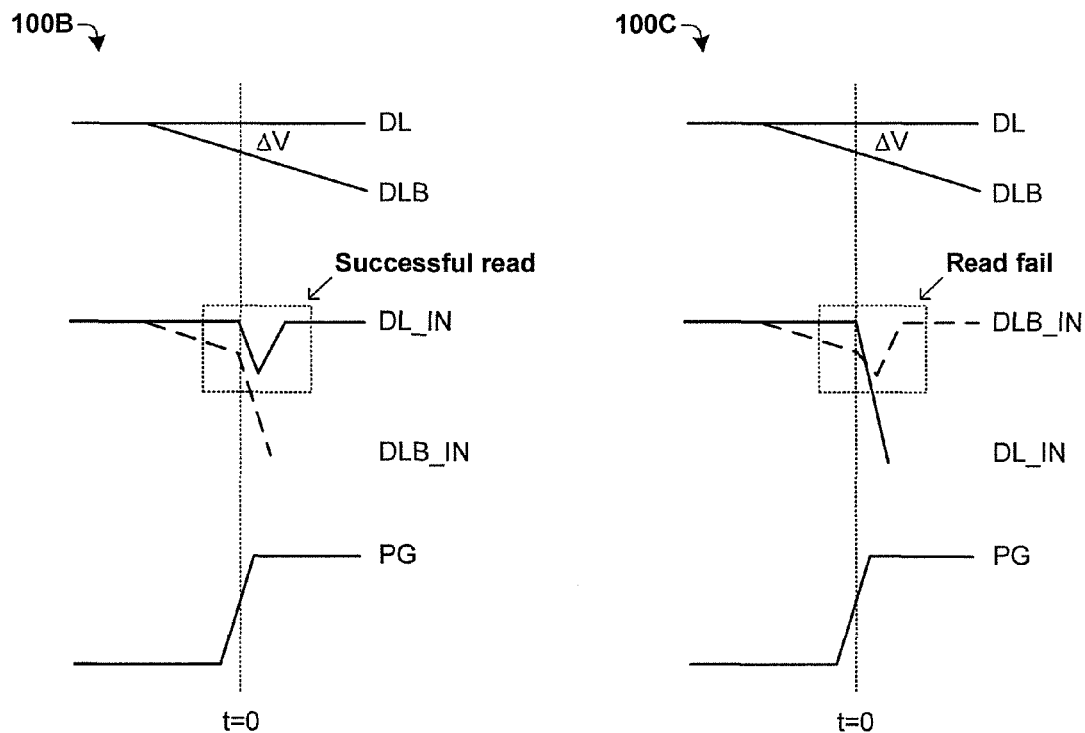

FIG. 1A illustrates a differential sense amplifier (SA) 100A, comprising a first inverter 102A and a second inverter 104A arranged in a cross-coupled configuration. The differential SA 100A is configured to receive a first complimentary data signal DL from a first switching element 106A, and a second a complimentary data signal DLB from a second switching element 108A. When a switch enable signal PG is turned on at t=0, as illustrated in FIG. 1B, the first complimentary data signal DL charges a first internal node 110A of the differential SA 100A to a first potential DUN, and the second complimentary data signal DLB charges a second internal node 112A of the differential SA 100A to a second potential DLB_IN.

A read margin of the differential SA 100A is defined as the delta voltage ($\Delta V$) between DL_IN and DLB_IN when PG is turn on. The first inverter 102A and the second inverter 104A each comprise a pull-down element (e.g., an n-type transistor on series with a p-type transistor). In read mode, DL_IN and DLB_IN will charge to $V_{DD}$ and $V_{DD}$-$\Delta V$, respectively. When these potentials discharge, the first inverter 102A and the second inverter 104A initially pull DL_IN and DLB_IN down. The delta voltage ($\Delta V$) in conjunction with the cross-coupled configuration of the first inverter 102A and the second inverter 104A will result in DLB_IN being pulled to ground (i.e., logical "0") with DL_IN being pulled to its original potential (i.e., logical "1"), as illustrated in FIG. 1B.

For the first and the second inverters 102A, 104A with identical pull-down characteristics the pull-down of DL_IN and DLB_IN will be the same. However, device characteristic mismatches driven by process variation due to semiconductor scaling, and resulting in a relative increase in device variation, increases a relative mismatch between the pull-down characteristics of the first and the second inverters 102A, 104A. If the mismatch between the first and the second inverters 102A, 104A is large enough, or the read margin of the differential SA 100A is less than a minimum threshold, the pull-down element of the second inverter 104A will pull DLB_IN below DL_IN, and result in a read fail of the memory device, as illustrated in FIG. 1C.

Accordingly, the present disclosure relates to a device and method to improve sense amplifier mismatch against process variation while simultaneously improving the read margin requirement for a differential sense amplifier. A differential sense amplifier comprising cross-coupled inverters with complimentary storage nodes is coupled to a current control element that changes a current through a first cross-coupled inverter based upon an output of a second cross-coupled inverter, and vice-versa. Other embodiments and associated methods are also disclosed.

Figure 2A:
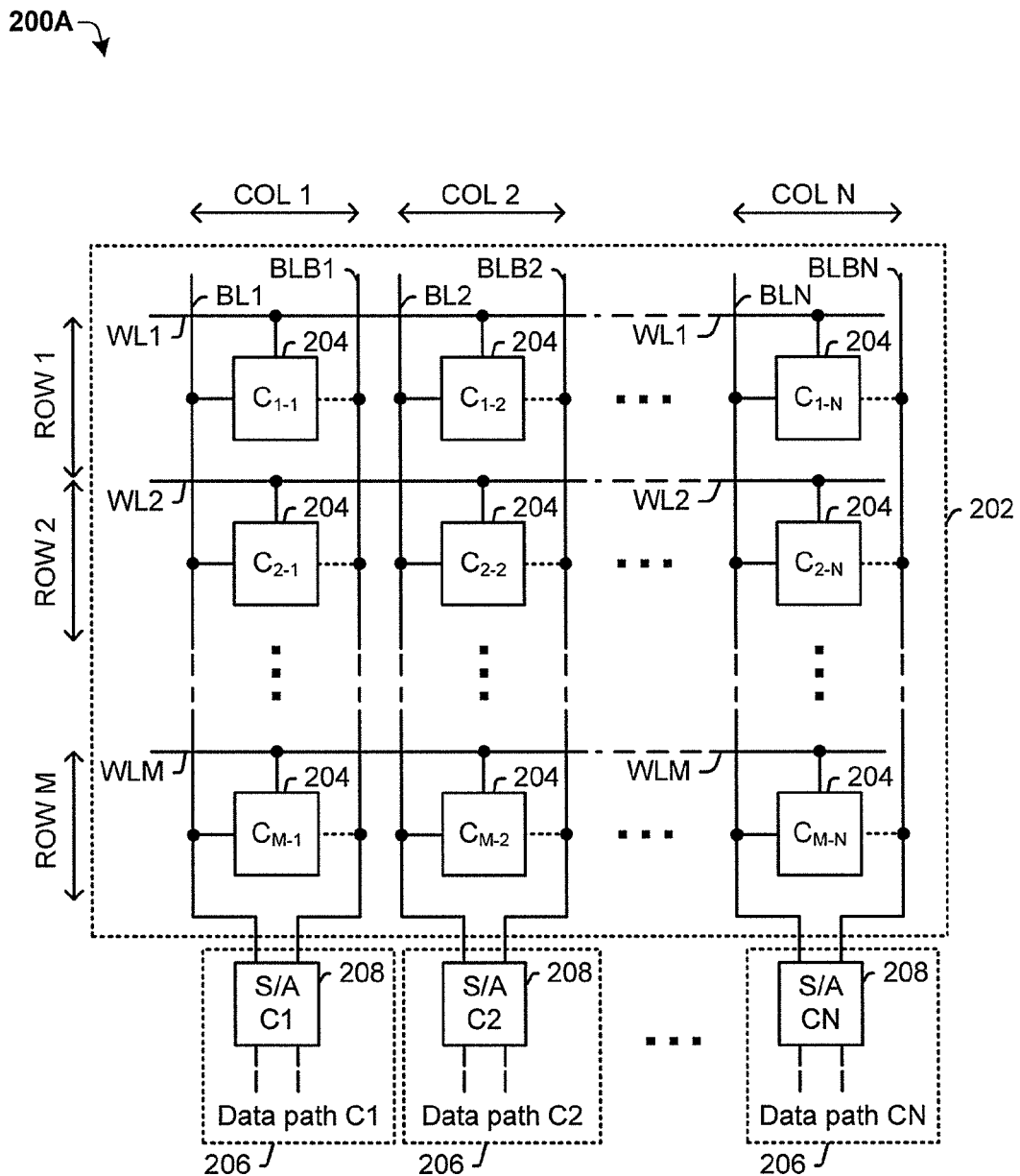
FIGS. 2A-2D illustrate some embodiments of a sense amplifier configured to compensate for pull-down device mismatch when reading data from a memory device.

FIG. 2A illustrates some embodiments of a semiconductor memory device 200A. The memory device 200A includes a memory array 202, which is made up of a plurality of memory cells 204 arranged in M rows and N columns. For clarity, the individual memory cells 204 in FIG. 2A are labeled $C_{row\text{-}column}$. Wordlines WL1-WLN are coupled to the memory cells 204 along respective rows, and complimentary bitlines BL1-BLN, BLB1-BLBN are coupled to the memory cells 204 along respective columns. For example, wordline WL1 is coupled to cells $C_{1\text{-}1}$ through $C_{1\text{-}N}$ along Row 1, and complementary bitlines BL1/BLB1 are coupled to cells $C_{1\text{-}1}$ through $C_{M\text{-}1}$ along Col. 1. To discern between two or more data states stored in the individual memory cells 204, data paths 206, which include corresponding sense amplifiers (SA) 208, are coupled to columns of memory cells 204. In some embodiments, the data paths 206 output data read from the memory device 200A to a latch, or other storage device.

Although FIG. 2A shows an embodiment where each column has a separate data path 206 and a corresponding SA 208 to read data states from that column, in other embodiments a data path and its corresponding sense amplifier can be shared (e.g., multiplexed) between multiple columns of memory cells 204 rather than being devoted to a single column of memory cells 204.

Figure 2B:
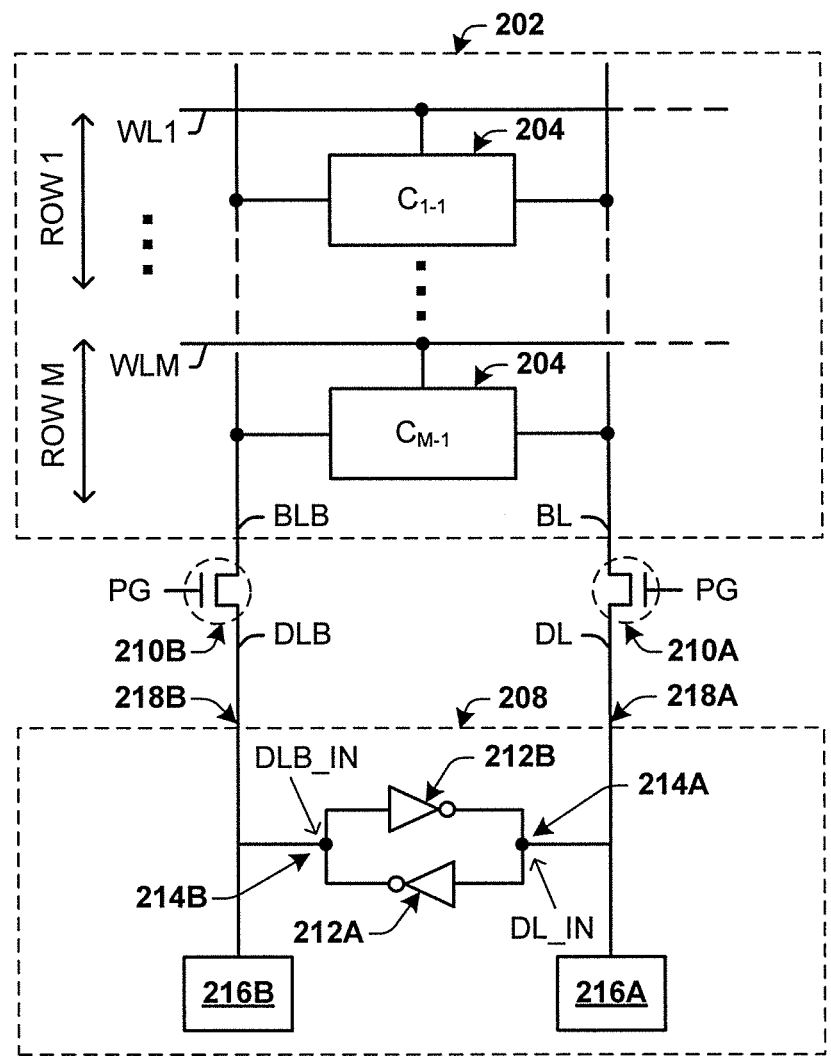

FIG. 2B illustrates a more detailed example of a column 200B (e.g., col. 1 of FIG. 2A), which includes memory cells 204 and a corresponding sense amplifier (SA) 208. Each memory cell 204 is coupled to complementary bitlines BL1, BLB1. First and second switching elements, 210A and 210B respectively, which are under direction of signal PG, selectively couple the complimentary bitlines BL1, BLB1 to SA 208. The SA 208 includes first and second cross-coupled inverters, 212A and 212B respectively, with first and second complimentary storage nodes, 214A and 214B respectively. The SA 208 also includes a first current control element 216A that changes a current through the first cross-coupled inverter 212A based upon an output of a second cross-coupled inverter 212B. Similarly, a second current control element 216B changes a current through the second cross-coupled inverter 212B based upon an output of a first cross-coupled inverter 212A. The first and second current control elements 216A, 216B are configured to compensate for DL_IN and DLB_IN mismatch in read mode of the memory array 202, to improve speed performance of the memory array 202 and reduce the read margin requirement for a successful read.

When the memory array 202 is in read mode, a first data input 218A connected to the first complimentary storage node 214A receives a first complimentary data signal DL from the first switching element 210A, and a second data input 218B connected to the second complimentary storage node 214B receives a second complimentary data signal DLB. DL charges the first complimentary storage node 214A to a first potential DL_IN. Likewise, DLB charges the second complimentary storage node 214B to a second potential DLB_IN. For the embodiments of FIG. 2B, the first potential DL_IN is greater than the second potential DLB_IN by a delta voltage ($\Delta V$) value.

To read a data value from a memory cell 204 (e.g., $\text{Cell}_{1-1}$), the complimentary bitlines BL1, BLB1 are first decoupled from the SA 208 by opening the first and second switching elements 210A, 210B (i.e., setting the signal PG=0), thereby decoupling complimentary bitlines BL1, BLB1 from the first and second complimentary storage nodes 214A, 214B. While decoupled, a pre-determined amount of charge is leaked from a supply voltage $V_{DD}$ onto the first and second complimentary storage nodes 214A, 214B. This pre-charged condition often represents a condition where the cross-coupled inverters 212A, 212B are in an intermediate, or "balanced" state, meaning that neither inverter 212A, 212B is strongly pulling towards a logical "0" or logical "1" state. After the first and second complimentary storage nodes 214A, 214B have been pre-charged to the intermediate state, the first and second switching elements, 210A and 210B, are closed, causing a voltage differential established on complimentary bitlines BL1, BLB1 to leak onto the first and second data inputs 218A, 218B and to the first and second complimentary storage nodes 214A, 214B. This re-coupling "tweaks" the pre-charged condition and changes the voltage differential on the first and second complimentary storage nodes 214A, 214B, thereby causing the cross-coupled inverters 212A, 212B to pull one way or another depending on the data state read from $\text{Cell}_{1-1}$, ultimately resulting in the cross-coupled inverters 212A, 212B mutually reinforcing the sensed data state.

Figure 2C:
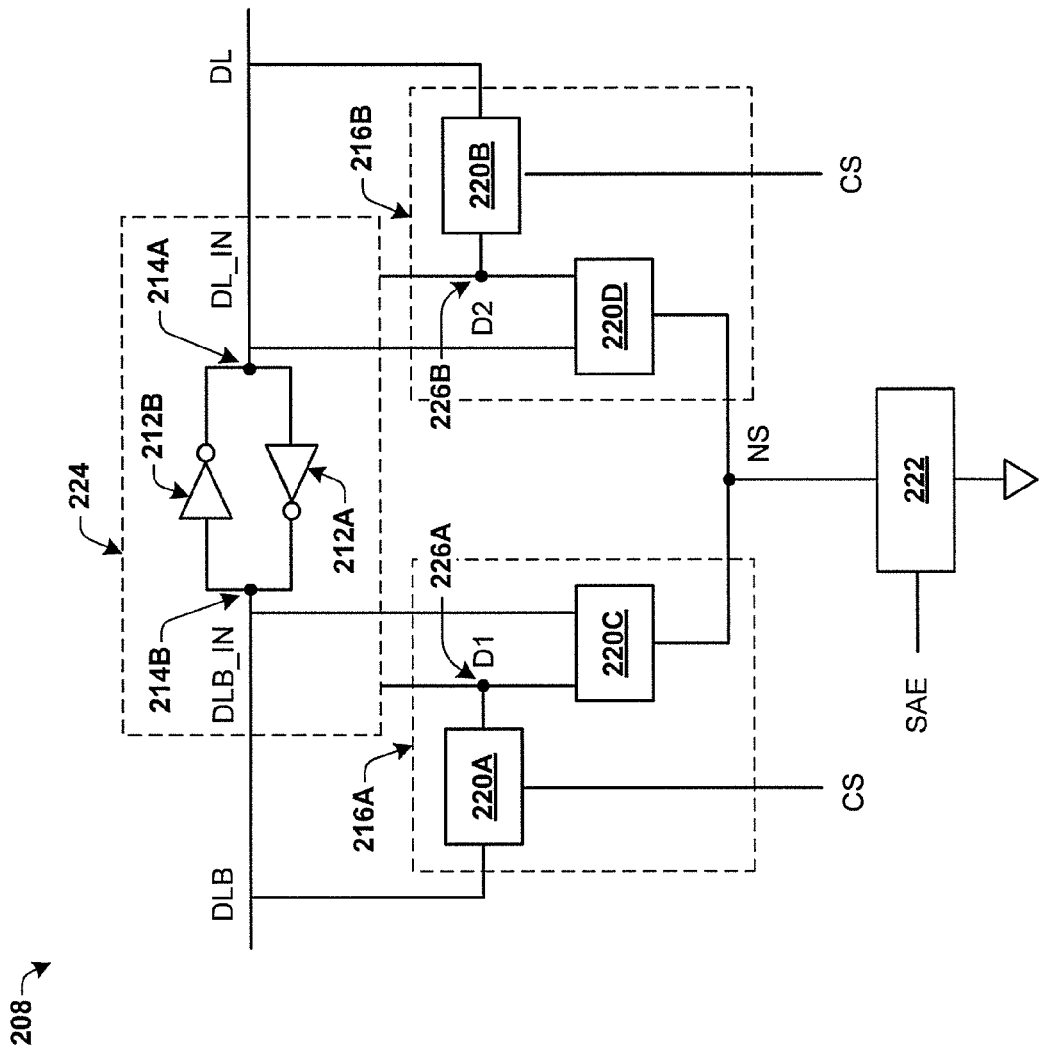

FIG. 2C illustrates a more detailed example of the sense amplifier (SA) 208 comprising a differential sense amplifier structure 224. The differential sense amplifier structure 224 comprises the first and second cross-coupled inverters 212A, 212B with the first and second complimentary storage nodes 214A, 214B, and is configured such that a first current control element 216A changes a current through the first cross-coupled inverter 212A based upon an output of a second cross-coupled inverter 212B, and a second current control element 216B changes a current through the second cross-coupled inverter 212B based upon an output of a first cross-coupled inverter 212A.

The first current control element 216A includes a first compensation switch 220A coupled to a first complimentary compensation node 226A, and configured to connect the first complimentary compensation node 226A to the second complimentary data signal DLB. A first pull-down element 220C is also connected to the first complimentary compensation node 226A and configured to pull current from the first complimentary compensation node 226A to ground based upon a second pull-down control signal received from the second complimentary storage node 214B. The first current control element 216A is also configured to couple the first complimentary compensation node 226A to the first complimentary storage 214A node through the first cross-coupled inverter 212A.

Likewise, the second current control element 216B includes a second compensation switch 220A coupled to a second complimentary compensation node 226B, and configured to connect the second complimentary compensation node 226B to the first complimentary data signal DL. A second pull-down element 220D is also connected to the second complimentary compensation node 226B and configured to pull current from the second complimentary compensation node 226B to ground based upon a first pull-down control signal received from the first complimentary storage node 214A. The second current control element 216B is also configured to couple the second complimentary compensation node 226B to the second complimentary storage 214B node through the second cross-coupled inverter 212B.

The first compensation switch 220A and the second compensation switch 220B are controlled by a same control signal CS. The first pull-down element 220C is connected to ground through an enable switch 222 such that a sense amp enable (SAE) signal instructs the enable switch 222 to send current from the first pull-down element 220C to ground. Likewise, the second pull-down element 220D is connected to ground through the enable switch 222 such that current is diverted from the second pull-down element 220C to ground in response to the SAE signal.

Figure 2D:
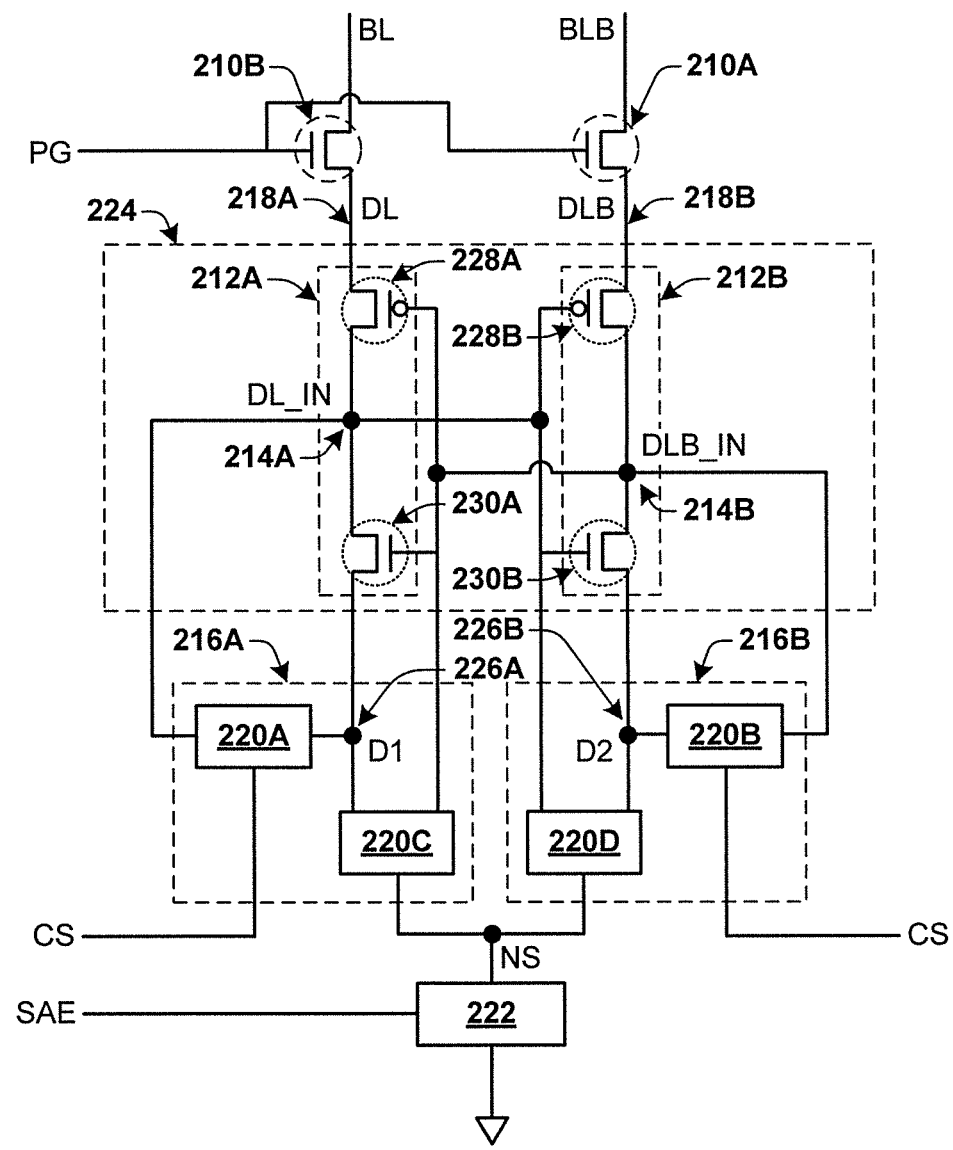

FIG. 2D illustrates another example of the sense amplifier (SA) 200D. In read mode, PG directs first and second switching elements 210A, 210B comprising n-type field-effect transistors (NFETs) with respective drains connected to first and second complementary bitlines BL, BLB, and respective sources connected to first and second data inputs 218A, 218B, to send first and second complimentary data signals DL, DLB to a differential sense amplifier structure 224. The differential sense amplifier structure 224 includes first and second respective cross-coupled inverters 212A, 212B connected to first and second respective complimentary storage nodes 214A, 214B which charge to first and second respective potentials DL_IN, DLB_IN.

The first cross-coupled inverter 212A comprises a first pull-up p-type FET (PFET) 228A with a drain connected to the first data input 218A to receive the first complimentary data signal DL, and a source connected to the drain of a first pull-down NFET 230A through the first complimentary storage node 214A. Gates of the first pull-up PFET 228A and the first pull-down NFET 230A are connected to the second complimentary storage node 214B. In a similar manner, the second cross-coupled inverter 212B comprises a second pull-up PFET 228B with a drain connected to the second data input 218B to receive the second complimentary data signal DLB, and a source connected to the drain of a second pull-down NFET 230B through the first complimentary storage node 214B. Gates of the second pull-up PFET 228A and the first pull-down NFET 230A are connected to the second complimentary storage node 214B.

By adding first and second pull-down elements 220C, 220D and first and second compensate switches 220A, 220B, first and second complimentary compensation nodes 226A, 226B will charge to the first and second respective potentials (i.e., D1→DL_IN, D2→DLB_IN) when CS is turned on. This coupling between the first and second respective complimentary storage nodes 214A, 214B and the first and second respective complimentary compensation nodes 226A, 226B can compensate for a mismatch of the pull-down characteristics of the first and second pull-down NFETs 230A, 230B. The first and second respective pull-down elements 220C, 220D act as a part of the first and second respective pull-down NFETs 230A, 230B in back-to-back inverters and separate first and second complimentary compensation nodes 226A, 226B from a shared node (NS). This compensation can be shown to reduce the SA mismatch by approximately 9% over some prior art approaches.

Figure 3:
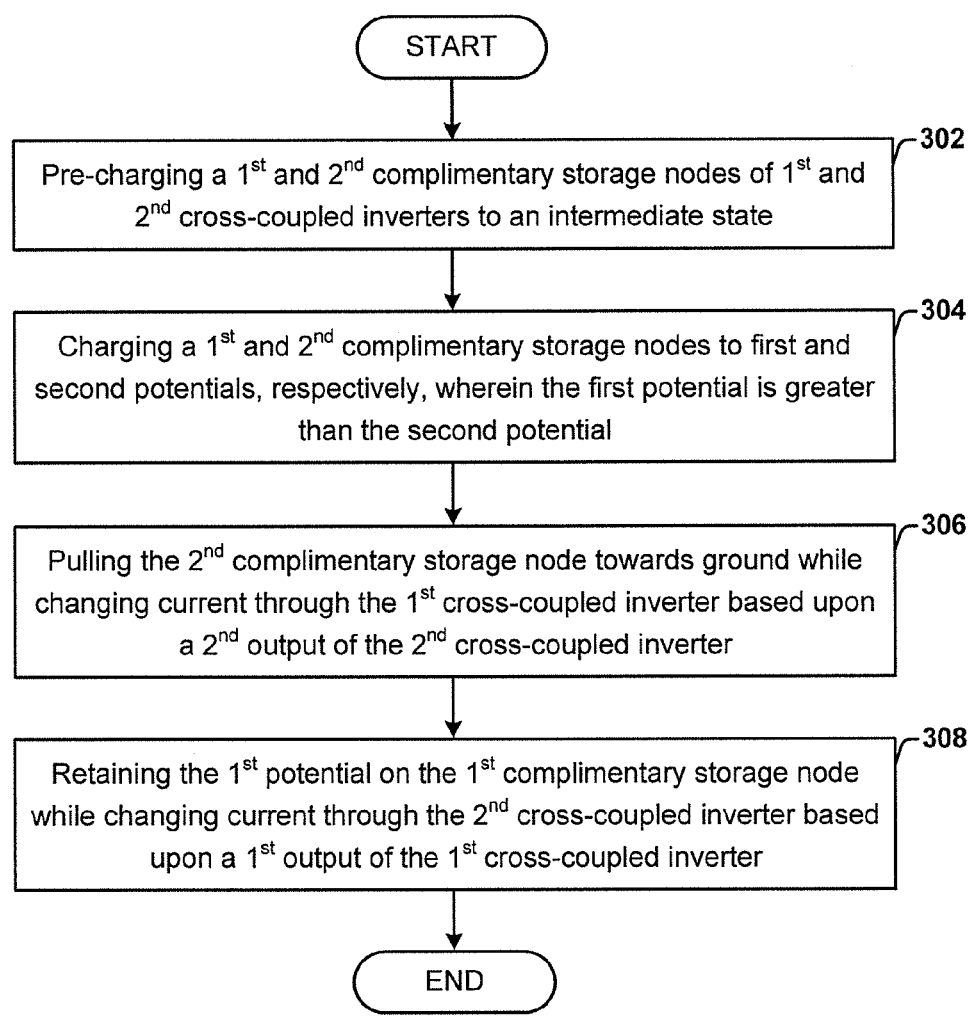
FIG. 3 illustrates some embodiments of a method of sense amplification.
Figure 5A:
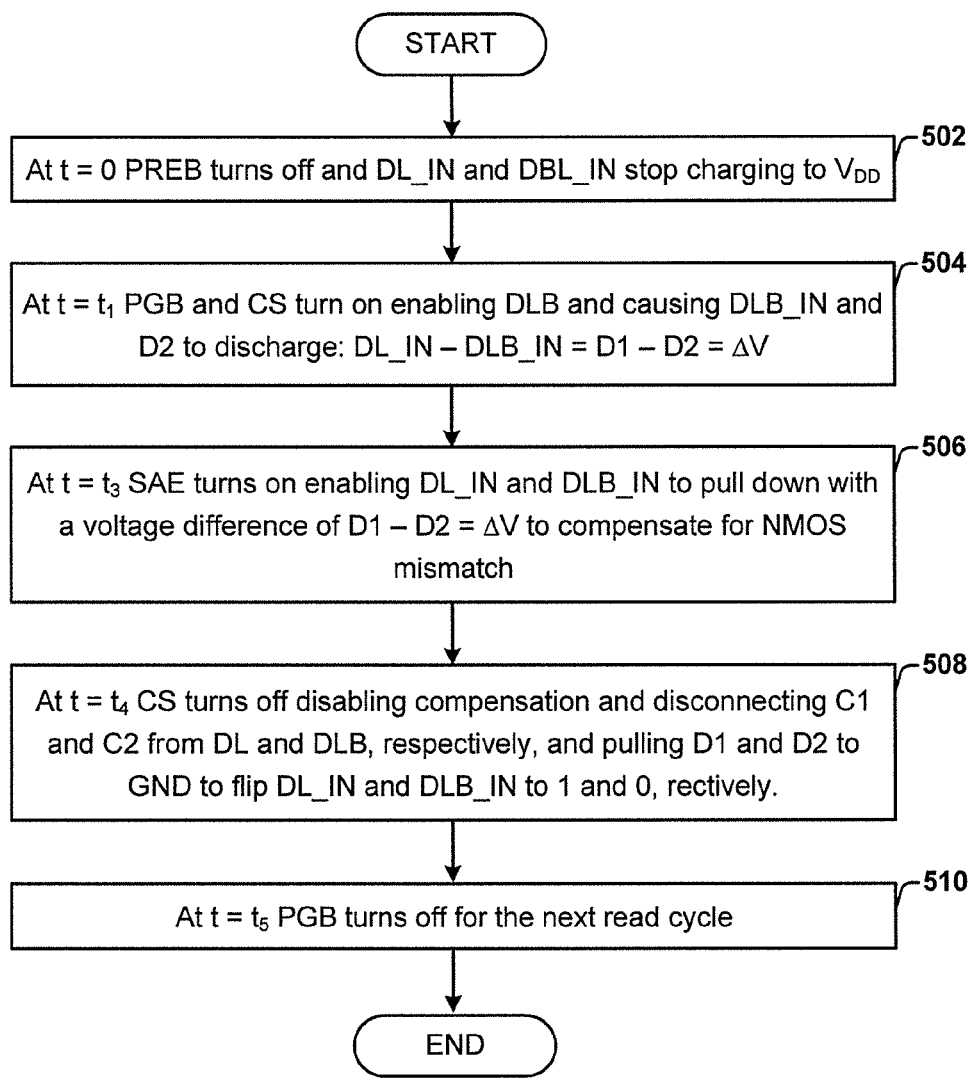
FIGS. 5A-5B illustrate some embodiments of a method of sense amplification of the differential sense amplifier of FIG. 4 and an associated timing diagram.

FIG. 3 illustrates some embodiments of a method 300 of sense amplification that may be utilized in accordance with the sense amplifiers of FIGS. 2A-2D. While the method disclosed in FIG. 3, and subsequently the method of FIG. 5A, are described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302 first and second complimentary storage nodes of first and second cross-coupled inverters are pre-charged to an intermediate state between logical "1" and logical "0."

At 304 first and second complementary data signals DL, DLB charge the first and second complimentary storage nodes to first and second respective potentials DL_IN, DLB_IN, where the first potential DL_IN is greater than the second potential DLB_IN by a delta voltage (ΔV) value. Simultaneously, first and second complimentary compensation nodes which are coupled to the first and second complimentary storage nodes, respectively, are also charged to the first and second respective potentials DL_IN, DLB_IN.

At 306 the second complimentary storage node is pulled towards ground while changing current through the first cross-coupled inverter based upon a second output of the second cross-coupled inverter with a second current control element to amplify a difference between the first and second potentials. Because DLB_IN is less than DL by ΔV, the second complimentary storage node and the second complimentary compensation node are both pulled to ground (i.e., logical "0") before the first complimentary storage node and the first complimentary compensation node. In some embodiments, changing current through the second cross-coupled inverter based upon the first output comprises coupling the first complimentary storage node to a first complimentary compensation node, charging the first complimentary compensation node to the first potential, and pulling the first complimentary compensation node towards ground. In some embodiments, pulling the first complimentary compensation node towards ground comprises coupling the first complimentary compensation node to a first compensation switch configured to charge the first complimentary storage node to the first potential DL_IN. And pulling the first complimentary compensation node towards ground further comprises connecting the first complimentary compensation node to a first pull-down element configured to pull current from the first complimentary compensation node to ground based upon a second pull-down control signal received from the second complimentary storage node, where the first complimentary compensation node is coupled to the first complimentary storage node through the first cross-coupled inverter.

At 308 the first complimentary storage node and the first complimentary compensation node retain the first potential (i.e., are pulled to logical "1") while changing current through the second cross-coupled inverter based upon a first output of the first cross-coupled inverter, resulting in a mutually reinforcing the sensed data state. In some embodiments, changing current through the first cross-coupled inverter based upon the second output comprises coupling the second complimentary storage node to a second complimentary compensation node, charging the second complimentary compensation node to the second potential, and pulling the second complimentary compensation node towards ground. In some embodiments, pulling the second complimentary compensation node towards ground comprises coupling the second complimentary compensation node to a second compensation switch and configured to charge the second complimentary storage node to the second potential DLB_IN. And pulling the second complimentary compensation node towards ground further comprises connecting the second complimentary compensation node to a second compensation switch configured to pull current from the second complimentary compensation node to ground based upon a first pull-down control signal received from the first complimentary storage node, where the second complimentary compensation node is coupled to the second complimentary storage node through the second cross-coupled inverter.

Figure 4:
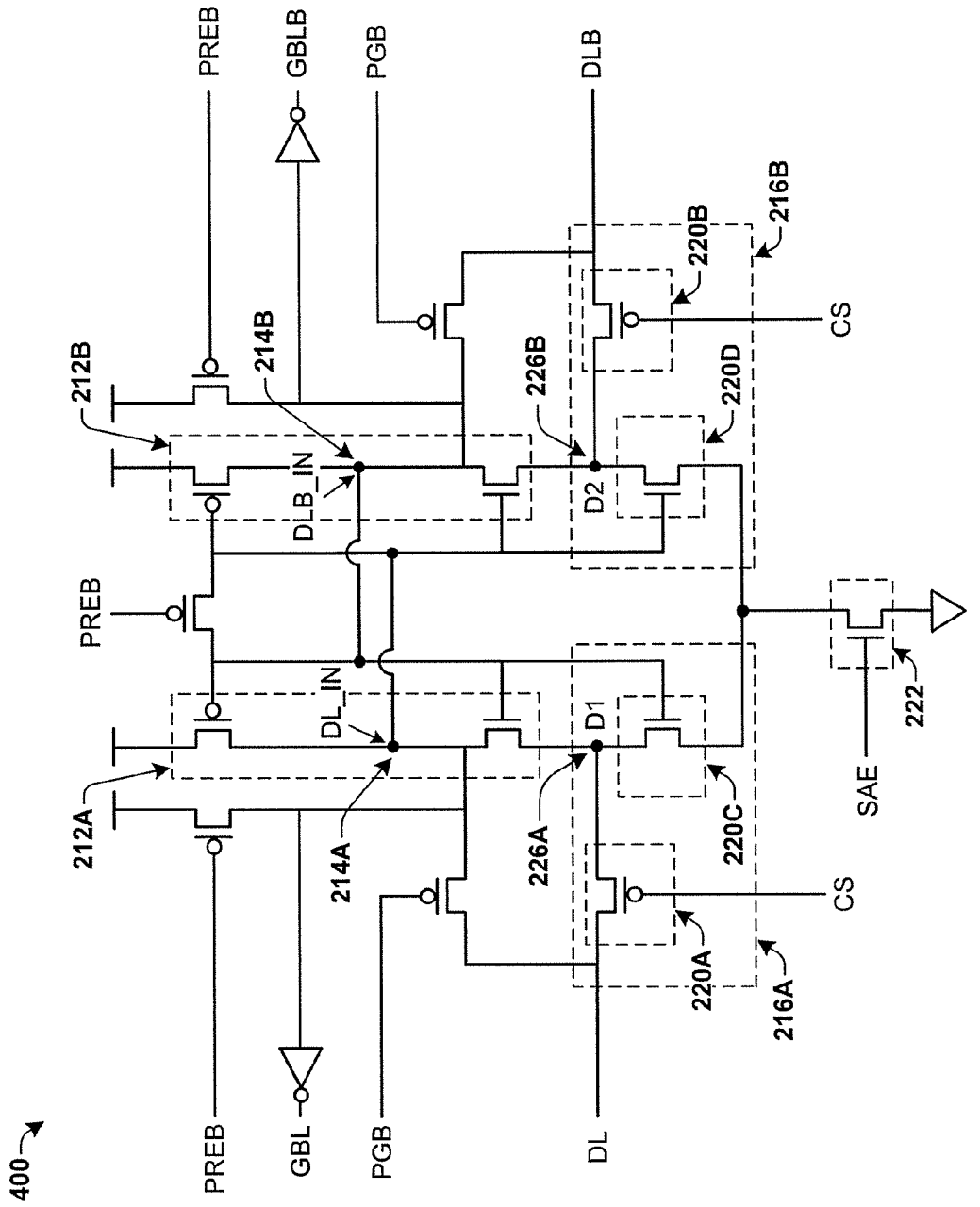
FIG. 4 illustrates some embodiments of a differential sense amplifier comprising cross-coupled inverters and current control elements configured to regulate current through the cross-coupled inverters.

FIG. 4 illustrates some embodiments of a differential sense amplifier 400 comprising first and second cross-coupled inverters 212A, 212B and first and second current control elements 216A, 216B configured to regulate current through the cross-coupled inverters first and second cross-coupled inverters 212A, 212B. The differential sense amplifier 400 includes first and second complimentary storage nodes 214A, 214B configured to receive first and second complimentary data signals DL, DLB from first and second data inputs 218A, 218B. The first and second current control elements 216A, 216B include first and second compensation switches 220A, 220B controlled by a same control signal (CS). The first and second compensation switches 220A, 220B comprise PFETs, and can be pass gates or transmission gates. The first and second compensation switches 220A, 220B are coupled to first and second complimentary compensation nodes 226A, 226B, and are configured to connect the first and second complimentary compensation nodes 226A, 226B to the second and first data inputs 218B, 218A, respectively.

The first and second current control elements 216A, 216B also include first and second pull-down elements 220C, 220D comprising NFETs connected to the first and second complimentary compensation nodes 226A, 226B, respectively. The first and second pull-down elements 220C, 220D are configured to pull current from the first and second complimentary compensation nodes 226A, 226B to ground based upon second and first pull-down control signals comprising the second and first potentials DLB_IN, DL_IN received from the second and first complimentary storage nodes, 214B, 214A respectively. The first complimentary compensation node 226A is coupled to the first complimentary storage node 214A through the first cross-coupled inverter 212A, and the second complimentary compensation node 226B is coupled to the second complimentary storage node 214B through the second cross-coupled inverter 212B.

A first source of the first pull-down element 220C and a second source of the second pull-down element 220D are connected to ground through an enable switch 222. A first drain of the first pull-down element 220C is connected to the first complimentary compensation node 226A, and a second drain of the second pull-down element 220D is connected to the second complimentary compensation node 226B. A first gate of the first pull-down element 220C is connected to the second complimentary storage node 214B, and a second gate of the second pull-down element 220D is connected to the first complimentary storage node 214A.

For first and second complementary data signals DL, DLB which charge the first and second complimentary storage nodes 214A, 214B to first and second respective potentials DL_IN, DLB_IN, where the first potential DL_IN is greater than the second potential DLB_IN by a delta voltage ($\Delta V$) value, if the pull-down characteristic of the first cross-coupled inverter 212A (i.e., the NFET) is greater than the pull-down characteristic of the second cross-coupled inverter 212B, DL_IN will be pulled up more than DLB_IN, because D1 is larger than D2 by $\Delta V$ (i.e., D1→DL_IN, D2→DLB_IN). Thus, the first and second current control elements 216A, 216B can keep DL_IN consistently above DLB_IN when SAE is turned on.

Figure 5B:
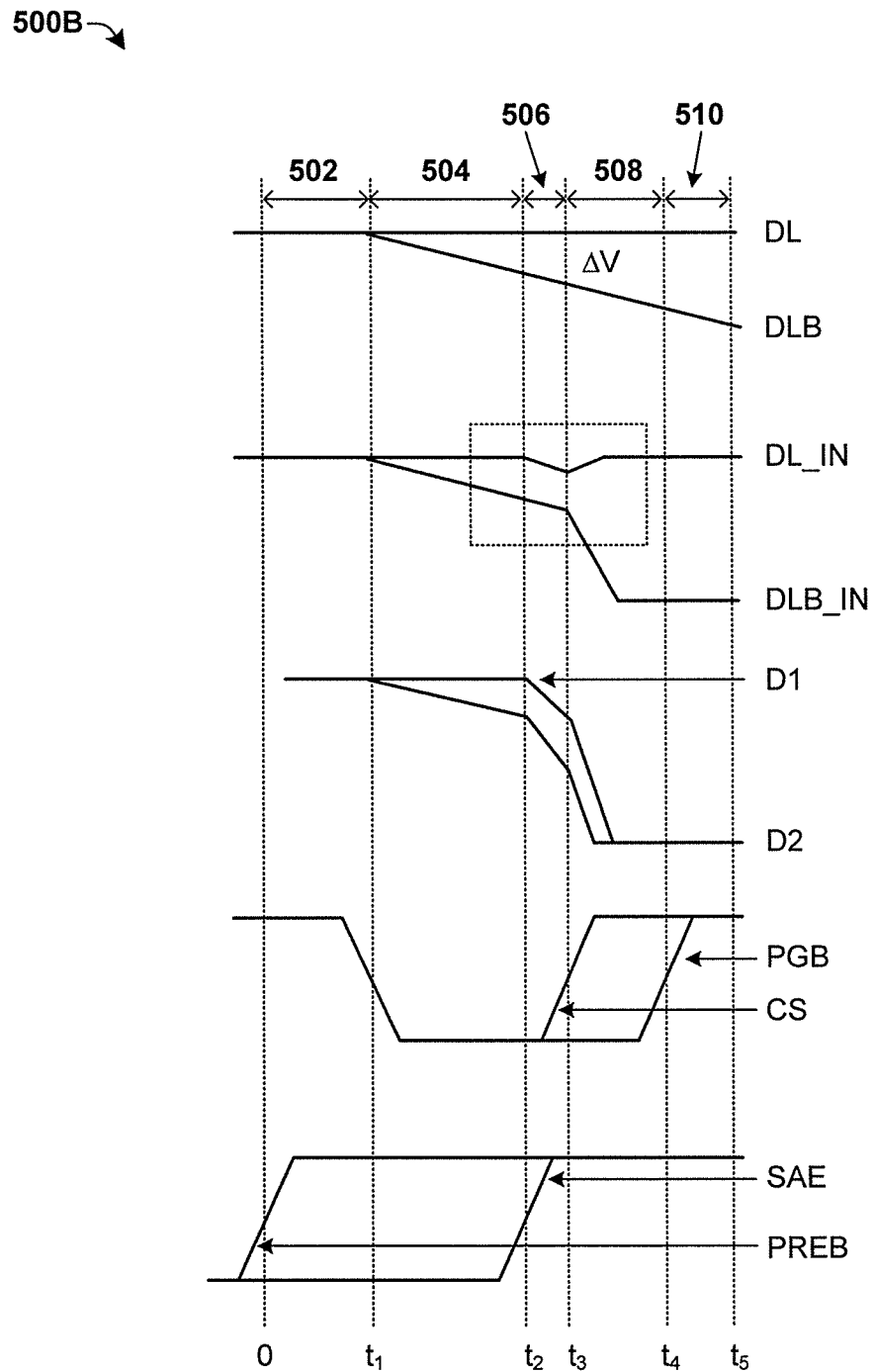

FIG. 5A illustrates some embodiments of a method 500A of sense amplification of the differential sense amplifier of FIG. 4. FIG. 5B illustrates an associated timing diagram to the method 500A.

At 502 (t=0) PREB turns off, and the first and second complimentary storage nodes 214A, 214B stop charging an intermediate state (i.e., $V_{DD}$).

At 504 (t=$t_1$) PGB and CS are turn on, DLB_IN will discharge from the second complimentary storage node 214B and the second complimentary compensation node 226B. The voltage difference between the first and second complimentary storage nodes 214A, 214B (i.e., $\Delta V$) is the same as the voltage difference between the first and second complimentary compensation nodes 226A, 226B.

At 506 (t=$t_2$) SAE turns on, both DL_IN and DLB_IN are pulled down with a voltage difference ($\Delta V$) to compensate for the pull-down characteristic mismatch between the first and second cross-coupled inverters 212A, 212B.

At 508 (t=$t_3$) CS turns off and the compensation is completed. The first and second compensation switches 220A disconnect the first and second pull-down elements 220C, 220D from the first and second complementary data signals DL, DLB. The first and second complimentary compensation nodes 226A, 226B are pulled to ground, and the voltage difference ($\Delta V$) between the first and second complimentary storage nodes 214A, 214B pulls the second complimentary storage node 214B to logic "0," thus flipping the first complimentary storage node 214A to logic "1" to achieve a mutually reinforcing the sensed data state. The sensed data is then sent through output buffers to first and second complementary global bitlines GBL, GBLB.

At 510 (t=$t_4$) PGB turns off for next read operation cycle.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a device and method to improve sense amplifier mismatch against process variation while simultaneously improving the read margin requirement for a differential sense amplifier. A differential sense amplifier comprising cross-coupled inverters with complimentary storage nodes is coupled to a current control element that changes a current through a first cross-coupled inverter based upon an output of a second cross-coupled inverter, and vice-versa.

In some embodiments, the present disclosure relates to a sense amplifier comprising first and second cross-coupled inverters with first and second complimentary storage nodes, and a first current control element that changes a current through the first cross-coupled inverter based upon an output of a second cross-coupled inverter.

In some embodiments, the present disclosure relates to a sense amplifier comprising first and second cross-coupled inverters with first and second complimentary storage nodes configured to receive first and second complimentary data signals from first and second data inputs, respectively, a first current control element that changes a current through the first cross-coupled inverter based upon an output of a second cross-coupled inverter, and a second current control element that changes a current through the second cross-coupled inverter based upon an output of a first cross-coupled inverter.

In some embodiments, the present disclosure relates to a method of amplification comprising pre-charging a first and second complimentary storage nodes of first and second cross-coupled inverters to an intermediate state, charging the first and second complimentary storage nodes to first and second potentials, respectively, wherein the first potential is greater than the second potential, and pulling the second complimentary storage node towards ground while changing current through the first cross-coupled inverter based upon a second output of the second cross-coupled inverter with a second current control element to amplify a difference between the first and second potentials. The method of amplification further comprises retaining the first potential on the first complimentary storage node while changing current through the second cross-coupled inverter based upon a first output of the first cross-coupled inverter.

What is claimed is:

1. A sense amplifier, comprising:
   first and second cross-coupled inverters with first and second complimentary storage nodes;
   a first current control element that changes a current through the first cross-coupled inverter based upon an output of the second cross-coupled inverter;
   first and second data inputs connected to the first and second complimentary storage nodes, respectively, through first and second pass gate transistors, respectively; and first and second compensation switches coupled to first and second complimentary compensation nodes, respectively, and configured to connect the first and second complimentary compensation nodes to the first and second data inputs, respectively;

wherein the first and second compensation switches are controlled by a same control signal, which is different than a pass gate control signal configured to operate the first and second pass gate transistors;

wherein the first complimentary compensation node is coupled to the first complimentary storage node through the first cross-coupled inverter; and wherein the second complimentary compensation node is coupled to the second complimentary storage node through the second cross-coupled inverter.

2. The sense amplifier of claim 1, further comprising a second current control element that changes a current through the second cross-coupled inverter based upon an output of the first cross-coupled inverter.

3. The sense amplifier of claim 2,
wherein the first data input is configured to receive a first complimentary data signal; and
wherein the second data input is configured to receive a second complimentary data signal.

4. The sense amplifier of claim 2, wherein the first current control element comprises:
a first pull-down element connected to the first complimentary compensation node, and configured to pull current from the first complimentary compensation node to ground based upon a second pull-down control signal received from the second complimentary storage node.

5. The sense amplifier of claim 4, wherein the second current control element comprises:
a second pull-down element connected to the second complimentary compensation node, and configured to pull current from the second complimentary compensation node to ground based upon a first pull-down control signal received from the first complimentary storage node.

6. The sense amplifier of claim 5, wherein the first compensation switch or the second compensation switch comprise a pass gate or transmission gate.

7. The sense amplifier of claim 5, wherein:
a first source of the first pull-down element is connected to ground through an enable switch;
a first drain of the first pull-down element is connected to the first complimentary compensation node; and
a first gate of the first pull-down element is connected to the second complimentary storage node.

8. The sense amplifier of claim 7, wherein:
a second source of the second pull-down element is connected to ground through the enable switch;
a second drain of the second pull-down element is connected to the second complimentary compensation node; and
a second gate of the second pull-down element is connected to the first complimentary storage node.

9. The sense amplifier of claim 4,
wherein the first pull-down element comprises a first pull down transistor having a gate connected to a first control signal that is different than the pass gate signal.

10. A sense amplifier, comprising:
a first inverter comprising a first transistor connected to a second transistor at a first data storage node;
a second inverter, cross-coupled with the first inverter, and comprising a third transistor connected to a fourth transistor at a second data storage node;
a first pass gate transistor connected between a data line and the first data storage node;
a second pass gate transistor connected between a complimentary data line and the second data storage node;
a first pull-down transistor connected between the first inverter and an enable switch, wherein the first pull down transistor has a first gate connected to the second data storage node;
a second pull-down transistor connected between the second inverter and the enable switch, wherein the second pull down transistor has a second gate connected to the first data storage node;
a first compensation switch connected between the data line and a first complimentary compensation node disposed between the first inverter and the first pull down transistor; and
a second compensation switch connected between the complimentary data line and a second complimentary compensation node disposed between the second inverter and the second pull down transistor;
wherein the first compensation switch and the second compensation switch are controlled by a same control signal, which is different than a pass gate control signal configured to operate the first pass gate transistor and the second pass gate transistor.

11. The sense amplifier of claim 10, wherein:
the first pull-down transistor and the second pull-down transistor comprise n-type field-effect transistors;
a first source of the first pull-down transistor and a second source of the second pull-down transistor are connected to ground through the enable switch;
a first drain of the first pull-down transistor is connected to the first complimentary compensation node; and
a second drain of the second pull-down transistor is connected to the second complimentary compensation node.

12. A method of amplification, comprising:
pre-charging first and second complimentary storage nodes of first and second cross-coupled inverters to an intermediate state;
charging the first and second complimentary storage nodes to first and second potentials, respectively, wherein the first potential is greater than the second potential; and
pulling the second complimentary storage node towards ground while changing current through the first cross-coupled inverter based upon a second output of the second cross-coupled inverter with a second current control element to amplify a difference between the first and second potentials; and
retaining the first potential on the first complimentary storage node while changing current through the second cross-coupled inverter based upon a first output of the first cross-coupled inverter by coupling the first complimentary storage node to a first complimentary compensation node, charging the first complimentary compensation node to the first potential, and pulling the first complimentary compensation node towards ground;
wherein the first and second complimentary storage nodes are charged to the first and second potentials according to a pass gate signal; and
wherein the first complimentary compensation node is charge to the first potential according to a first control signal different than the pass gate signal.

13. The method of claim 12, wherein pulling the first complimentary compensation node towards ground comprises:

coupling the first complimentary compensation node to a first compensation switch configured to charge the first complimentary storage node to the first potential; and connecting the first complimentary compensation node to a first pull-down element configured to pull current from the first complimentary compensation node to ground based upon a second pull-down control signal received from the second complimentary storage node;

wherein the first complimentary compensation node is coupled to the first complimentary storage node through the first cross-coupled inverter.

14. The method of claim 12, wherein changing current through the first cross-coupled inverter based upon the second output comprises:

coupling the second complimentary storage node to a second complimentary compensation node;

charging the second complimentary compensation node to the second potential; and pulling the second complimentary compensation node towards ground.

15. The method of claim 14, wherein pulling the second complimentary compensation node towards ground comprises:

coupling the second complimentary compensation node to a second compensation switch configured to charge the second complimentary storage node to the second potential; and connecting the second complimentary compensation node to a second pull-down element configured to pull current from the second complimentary compensation node to ground based upon a first pull-down control signal received from the first complimentary storage node;

wherein the second complimentary compensation node is coupled to the second complimentary storage node through the second cross-coupled inverter.

* * * * *